(12) United States Patent
Rabinovich

(10) Patent No.: US 10,704,136 B2
(45) Date of Patent: Jul. 7, 2020

(54) CATHODIC ARC DEPOSITION STINGER

(71) Applicant: United Technologies Corporation, Hartford, CT (US)

(72) Inventor: Albert Rabinovich, West Hartford, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 915 days.

(21) Appl. No.: 14/196,741

(22) Filed: Mar. 4, 2014

(65) Prior Publication Data

US 2014/0251791 A1 Sep. 11, 2014

Related U.S. Application Data

(60) Provisional application No. 61/772,892, filed on Mar. 5, 2013.

(51) Int. Cl.
*C23C 14/32* (2006.01)
*H01J 37/34* (2006.01)
*H01J 37/32* (2006.01)

(52) U.S. Cl.
CPC ...... *C23C 14/325* (2013.01); *H01J 37/32577* (2013.01); *H01J 37/34* (2013.01)

(58) Field of Classification Search
CPC .......................... C23C 14/325; H01J 37/32055
USPC ....................................... 204/298.41, 192.38
See application file for complete search history.

(56) References Cited

U.S. PATENT DOCUMENTS

| | | | |
|---|---|---|---|
| 5,126,030 A | 6/1992 | Tamagaki et al. | |
| 5,192,894 A | 3/1993 | Teschner | |
| 5,269,896 A | 12/1993 | Munemasa et al. | |
| 5,281,321 A | 1/1994 | Sturmer et al. | |
| 5,902,462 A | 5/1999 | Krauss | |
| 5,932,078 A * | 8/1999 | Beers ................ | H01J 37/32055 204/192.38 |
| 6,027,619 A | 2/2000 | Cathey et al. | |
| 6,207,029 B1 * | 3/2001 | Bergmann ........ | H01J 37/32422 118/723 VE |
| 6,663,755 B2 | 12/2003 | Gorokhovsky | |
| 6,929,727 B2 | 8/2005 | Gorokhovsky | |
| 7,175,926 B2 | 2/2007 | Ma et al. | |
| 7,252,745 B2 | 8/2007 | Gorokhovsky | |
| 7,300,559 B2 | 11/2007 | Gorokhovsky | |
| 8,241,468 B2 * | 8/2012 | Beers .................... | C23C 14/325 204/192.38 |
| 8,282,794 B2 | 10/2012 | Gorokhovsky | |
| 8,968,528 B2 * | 3/2015 | Tryon .................... | C23C 14/16 204/192.15 |
| 2003/0230483 A1 * | 12/2003 | Sunthankar .......... | C23C 14/325 204/298.41 |
| 2005/0121321 A1 * | 6/2005 | Schutze ............ | H01J 37/32055 204/298.41 |

FOREIGN PATENT DOCUMENTS

JP 63-018056 A * 1/1988 ............. C23C 14/24

OTHER PUBLICATIONS

Translation to Okamoto (JP 63-018056) published Jan. 1988.*

* cited by examiner

*Primary Examiner* — John J Brayton
(74) *Attorney, Agent, or Firm* — Getz Balich LLC

(57) ABSTRACT

A stinger for a cathodic arc vapor deposition system includes a head with a reduced area contact interface.

18 Claims, 4 Drawing Sheets

CATHODIC ARC DEPOSITION STINGER

This application claims priority to U.S. Patent Appln. No. 61/772,892 filed Mar. 5, 2013.

BACKGROUND

The present disclosure relates to Cathodic arc deposition and, more particularly, to a stinger therefor.

Cathodic arc deposition or Arc-PVD is a physical vapor deposition technique in which an electric arc is used to vaporize material from a cathode ingot target. The vaporized material then condenses on a workpiece to form a thin film. The technique can be used to deposit metallic, ceramic, and composite films. Cathodic arc deposition is an important production process for aerospace companies and their suppliers to coat components such as, for example, airfoils and other components that operate in high temperature environments.

Although effective, the cathodic arc deposition process may result in premature cracks in the cathode ingot target. As a result, substantial cost and part scrap may be incurred.

SUMMARY

A stinger for a cathodic arc vapor deposition system according to one disclosed non-limiting embodiment of the present disclosure includes a head with a reduced area contact interface.

According to another disclosed non-limiting embodiment of the present disclosure includes a wherein the reduced area contact interface defines a ring in cross-section.

A further embodiment of any of the foregoing embodiments of the present disclosure includes wherein the reduced area contact interface defines a button in cross-section.

A further embodiment of any of the foregoing embodiments of the present disclosure includes wherein the reduced area contact interface includes an air gap.

A further embodiment of any of the foregoing embodiments of the present disclosure includes wherein the reduced area contact interface includes an inner wall spaced from an outer wall, the outer wall defines the reduced area contact interface.

A further embodiment of any of the foregoing embodiments of the present disclosure includes wherein the head is manufactured of a copper alloy.

A further embodiment of any of the foregoing embodiments of the present disclosure includes wherein the head is water-cooled.

A further embodiment of any of the foregoing embodiments of the present disclosure includes wherein the head defines a first cross-sectional area, the reduced area contact interface defines a second cross-sectional area less than the first cross-sectional area.

A further embodiment of any of the foregoing embodiments of the present disclosure includes wherein the head is circular in cross-section.

A further embodiment of any of the foregoing embodiments of the present disclosure includes wherein the reduced area contact interface is operable to contact a cathode.

A cathodic arc vapor deposition system according to another disclosed non-limiting embodiment of the present disclosure includes a fixed support; and a contactor with a reduced area contact interface to retain a cathode between the fixed support and the reduced area contact interface.

A further embodiment of any of the foregoing embodiments of the present disclosure includes wherein the reduced area contact interface is manufactured of a copper alloy and the fixed support is manufactured of a stainless steel with isolative layers.

A further embodiment of any of the foregoing embodiments of the present disclosure includes wherein the contactor is water-cooled.

A further embodiment of any of the foregoing embodiments of the present disclosure includes wherein the reduced area contact interface defines a ring in cross-section.

A further embodiment of any of the foregoing embodiments of the present disclosure includes wherein the reduced area contact interface defines a button in cross-section.

A further embodiment of any of the foregoing embodiments of the present disclosure includes wherein the reduced area contact interface includes an air gap.

A method of cathodic arc vapor deposition according to another disclosed non-limiting embodiment of the present disclosure includes a retaining a cathode with a reduced area contact interface that extends from a head of a contactor.

According to another disclosed non-limiting embodiment of the present disclosure includes a water-cooling the head.

According to another disclosed non-limiting embodiment of the present disclosure includes a retaining the cathode between the reduced area contact interface and a fixed support

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
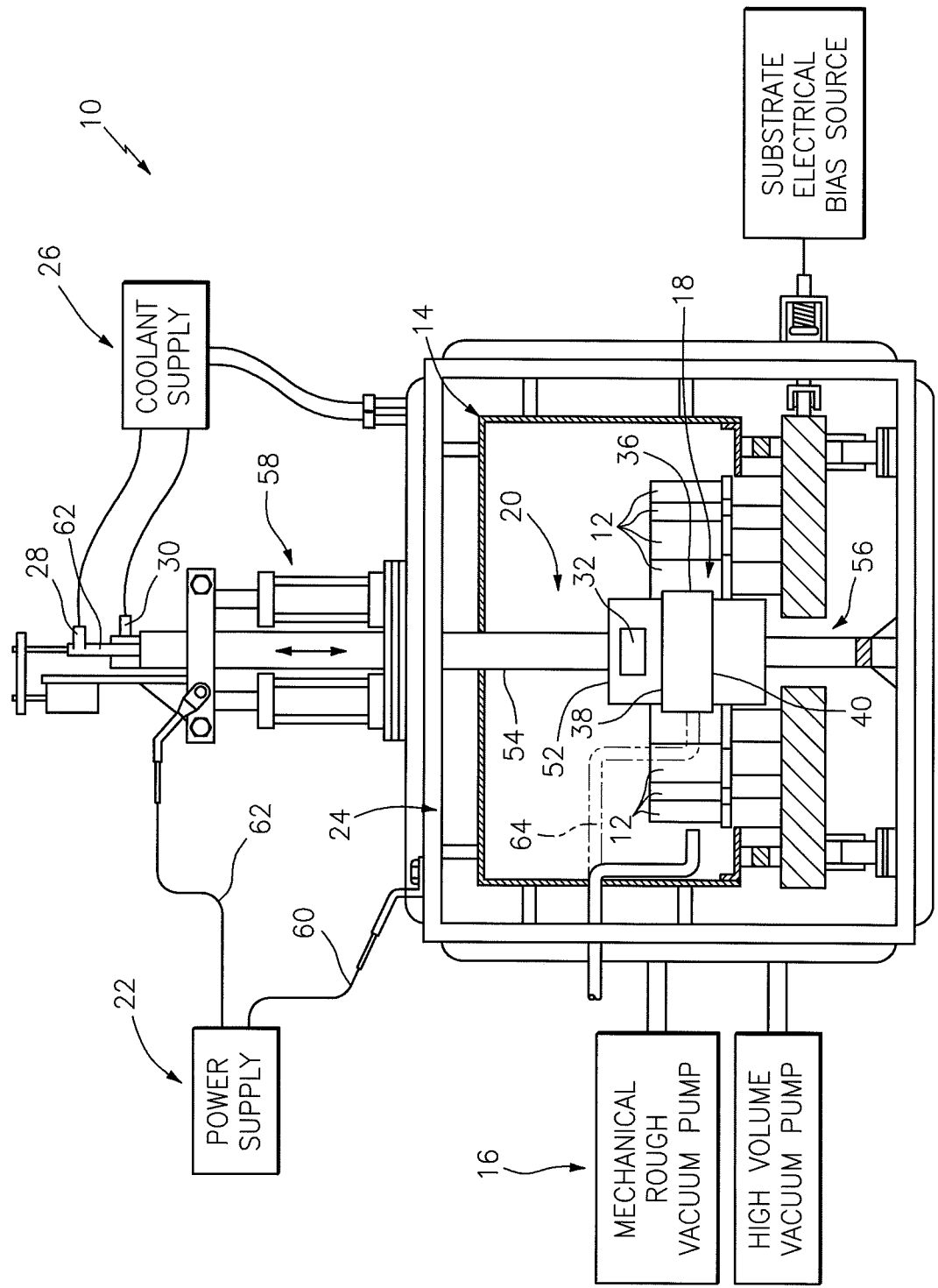
FIG. 1 is a schematic partial sectional view of a cathodic arc vapor deposition system.

FIG. 1 schematically illustrates a cathodic arc vapor deposition system 10 for cathodic arc vapor deposition onto a workpiece 12. The cathodic arc vapor deposition system 10 generally includes a vessel 14, a vacuum system 16 to maintain a vacuum in the vessel 14, a cathode 18, a contactor 20, a power supply 22 to sustain an arc of electrical energy between the cathode 18 and an anode 24, and a magnetic director 32 to steer the arc around the cathode 18. A water-cooler supply subsystem 26 maintains the system 10 within acceptable temperatures by cycling coolant through cooling passages 28, 30 within the vessel 14 and the contactor 20.

Figure 2:
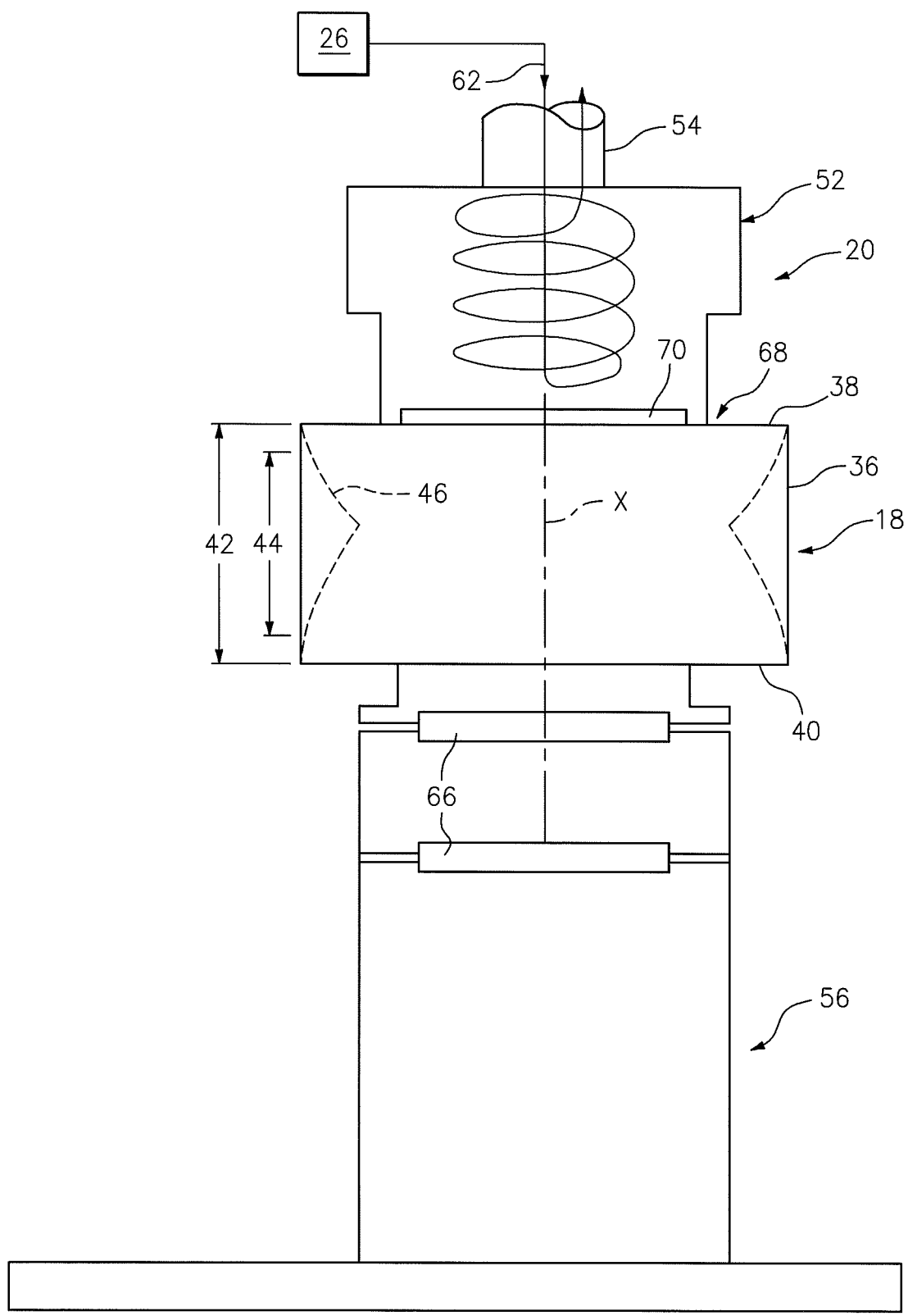
FIG. 2 is a schematic view of stinger for a cathodic arc vapor deposition system according to one disclosed non-limiting embodiment.

The cathode 18 is a substantially cylindrical disk or puck with an evaporative surface 36 that extends between a pair of end surfaces 38, 40. The end surfaces 38, 40 are substantially parallel with one another. The coating to be deposited dictates the material composition of the cathode 18, and often the cathode 18 may be an ingot cut from a cast rod. An axial length 42 of the cathode 18 is typically longer than the anticipated final width 44 of an erosion pattern 46 (illustrated schematically; FIG. 2) along the evaporative surface 36 of the cathode 18.

The contactor 20 generally includes a head 52 attached to a shaft 54 to retain the cathode 18 on a fixed support 56. The head 52 attached to a shaft 54 are generally circular in cross-section, however, other geometries may alternatively be provided. The head 52 is positioned inside the vessel 14 and the shaft 54 extends outside the vessel 14 to an actuator 58 that selectively actuates the contactor 20 into electrical contact with the cathode 18. The contactor 20 may be electrically insulated from the vessel 14. The contactor 20 may also include a coolant passage 62 positioned within the shaft 54 to supply coolant to the head 52 from the coolant supply 26.

The arc evaporation process begins with the striking of a high current, low voltage arc on the evaporative surface 36 of the cathode 18 from the anode 24 that gives rise to a relatively small highly energetic emitting area known as a cathode spot. The localized temperature at the cathode spot may be approximately 2750° F. (1500° C.), which results in a relatively high velocity (6 miles/s; 10 km/s) jet of vaporized cathode material, leaving a crater behind on the cathode surface. The cathode spot is only active for a short period of time, then self-extinguishes and re-ignites in a new area adjacent thereto in response to the magnetic director 32 or a mechanical movement. The magnetic director 32 may be at least partially disposed within the head 52 and may include permanent magnets, electromagnets or combinations thereof.

The power supply 22 sustains an arc of electrical energy between the cathode 18 and the anode 24 with, for example, a direct current (D.C.) power supply. The arc that forms between the cathode 18 and the anode 24 may be referred to as a plasma beam. In one disclosed non-limiting embodiment, a positive lead 60 from the power supply 114 is connected to the vessel 14, such that the vessel 14 operates as the anode 24. A negative lead 62 of the power supply 22 may be electrically connected to the contactor shaft 52. In other disclosed non-limiting embodiments, the anode may be disposed inside the vessel 14. An arc initiator 64, maintained at or near the electrical potential of the vessel 14, may be utilized to initiate the arc.

With reference to FIG. 2, the fixed support 56 may manufactured of a stainless steel with isolative layers 66 manufactured of a non-metallic material such as alumina or other ceramic material. The fixed support 56 in the illustrated non-limiting embodiment provides a double layer or isolation for the cathode 18, however other layers may alternatively or additionally be provided.

The head 52 and the shaft 54—often referred to as the "stinger"—are fabricated from an electrically conductive material such as a copper alloy. The head 52 includes a reduced area contact interface 68 that reduces the in-process stress on the cathode 18 due to thermal gradients.

In one disclosed non-limiting embodiment the reduced area contact interface 68 is defined along the outer diameter of the head 52. That is, the reduced area contact interface 68 is essentially a ring with an air gap 70 formed therein. The head 52 defines a first cross-sectional area A while the reduced area contact interface 68 defines a second cross-sectional area B that is less than the first cross-sectional area A. The air gap 70 facilitates insulated properties between the head 52 and the cathode 18.

The reduced area contact interface 68 may be determined with respect to the expected maximum resistance under current flow. That is, the reduced area contact interface 68 is sized to permit efficient current flow to minimize resistive heating of the cathode 18.

Thermal gradients result from the difference in temperature of the water-cooled copper alloy stinger and the cathode 18 which may be heated by the applied arc load to approximately 1200° F. (648° C.). The water-cooled copper alloy stinger cools the cathode 18 at the cathode-ingot interface and may cause thermal stress. The reduced area contact interface 68 of the water-cooled copper alloy stinger effectively reduces the cooling affect on the cathode 18 to reduce the thermal-stress. This minimizes—if not eliminates—the potential for the cathode to crack or split.

Figure 3:
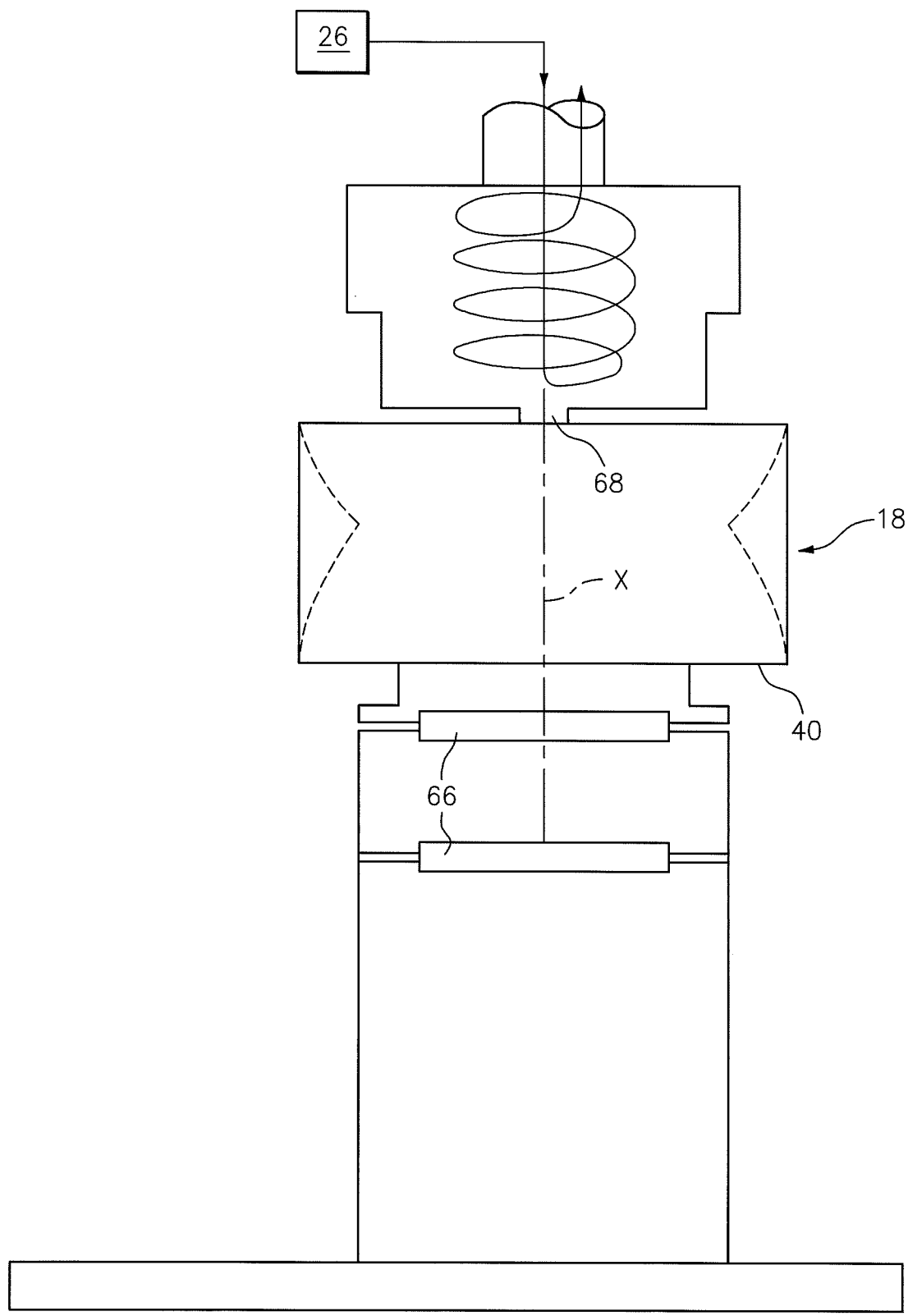
FIG. 3 is a schematic view of stinger for a cathodic arc vapor deposition system according to another disclosed non-limiting embodiment.

With reference to FIG. 3, the reduced area contact interface 68 in another disclosed non-limiting embodiment is a button along a centerline X of the stinger. It should be understood that the button may be round or of other cross-sectional geometries. The size of the button may again be determined with respect to the expected maximum resistance under current flow such that the effective contact area thereof may be generally equivalent to that of the ring in FIG. 2.

Figure 4:
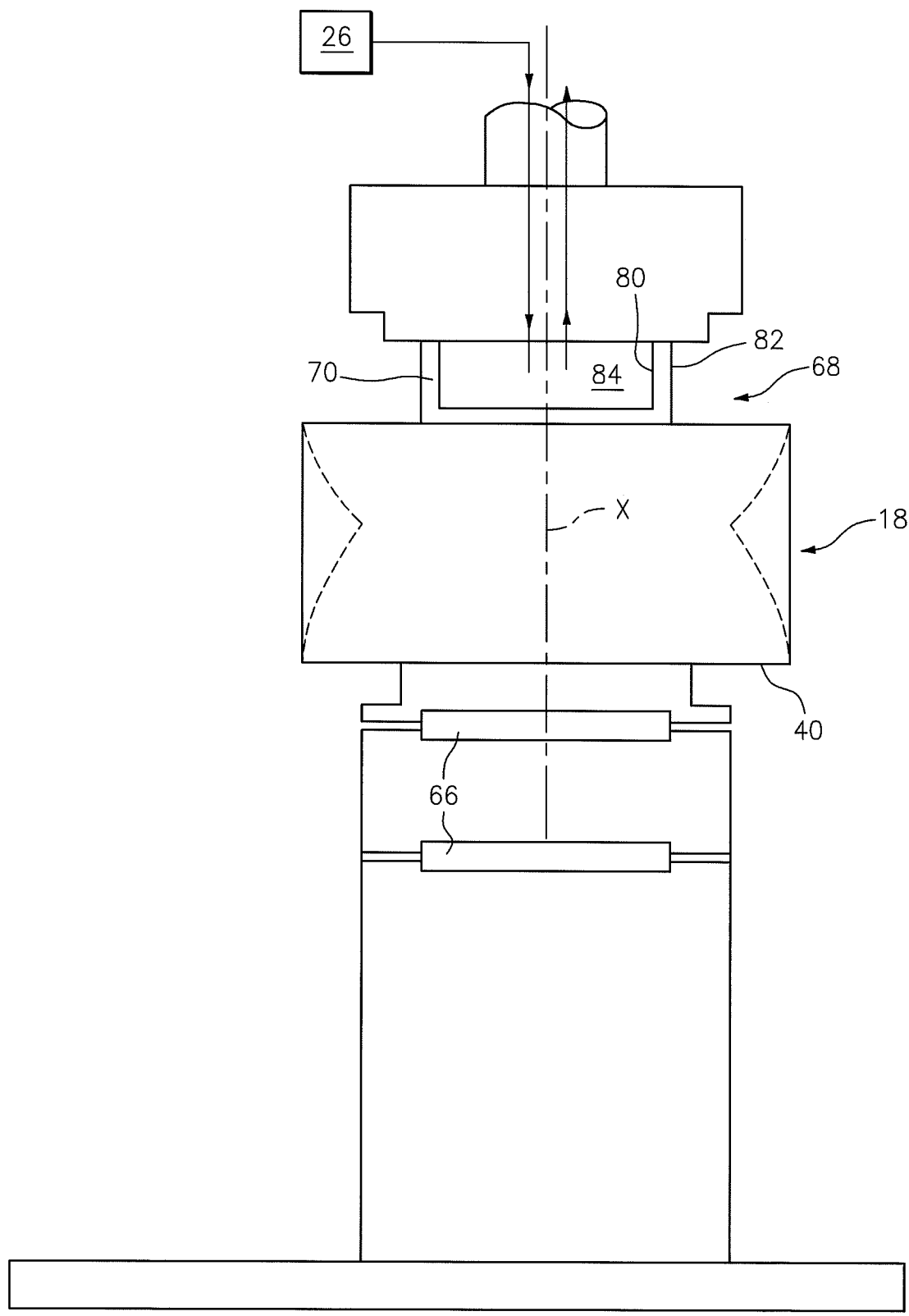
FIG. 4 is a schematic view of stinger for a cathodic arc vapor deposition system according to another disclosed non-limiting embodiment.

With reference to FIG. 4, the reduced area contact interface 68 in another disclosed non-limiting embodiment includes an air gap 70 between an inner wall 80 and an outer wall 82. That is, the air gap 70 is generally U-shaped in cross-section. The inner wall 80 defines a water-cooled compartment 84 within which water from the water-cooler supply subsystem 26 circulates. That is, the inner wall 80 with the water-cooled compartment 84 cools the stinger yet the outer wall 82 provides a reduced cooling effect upon the cathode 18. It should be understood that various geometries may be provided for the air gap 70.

It should be understood that like reference numerals identify corresponding or similar elements throughout the several drawings. It should also be understood that although a particular component arrangement is disclosed in the illustrated embodiment, other arrangements will benefit herefrom.

Although the different non-limiting embodiments have specific illustrated components, the embodiments of this invention are not limited to those particular combinations. It is possible to use some of the components or features from any of the non-limiting embodiments in combination with features or components from any of the other non-limiting embodiments.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A cathodic arc vapor deposition system, comprising:
   a fixed support; and
   a stinger comprising a shaft and a head attached to the shaft;

the shaft having a lateral shaft width, the head having a lateral head width that is greater than the lateral shaft width, and the lateral head width and the lateral shaft width are measured in a lateral direction that is perpendicular to a centerline of the stinger;

the head configured with a contact interface surface adapted to contact a cathode and thereby retain the cathode between the fixed support and the head;

the contact interface surface having a ring shaped cross-section; and the head further configured with a pocket that extends a longitudinal distance along the centerline into the head from the contact interface surface to a pocket end surface;

wherein an inner lateral width of the ring shaped cross-section that is measured in the lateral direction is greater than the longitudinal distance.

2. The cathodic arc vapor deposition system of claim 1, wherein the contact interface surface forms a reduced area contact interface of the head.

3. The cathodic arc vapor deposition system of claim 2, wherein the pocket provides an air gap between the pocket end surface and the cathode.

4. The cathodic arc vapor deposition system of claim 2, wherein
the head defines a first cross-sectional area; and
the reduced area contact interface defines a second cross-sectional area less than the first cross-sectional area.

5. The cathodic arc vapor deposition system of claim 1, wherein an inner peripheral surface of the head forms an airgap within the ring shaped cross-section of the contact interface surface.

6. The cathodic arc vapor deposition system of claim 1, wherein the head comprises copper alloy.

7. The cathodic arc vapor deposition system of claim 1, wherein the head is water cooled.

8. The cathodic arc vapor deposition system of claim 1, wherein the shaft is water cooled.

9. The cathodic arc vapor deposition system of claim 1, wherein a base portion of the head is circular in cross-section.

10. A method involving a cathodic arc vapor deposition system, the method comprising:
positioning a cathode on a fixed support within a vessel; and
moving a stinger towards the cathode to retain the cathode between the fixed support and a contact interface surface of the stinger, wherein the contact interface surface contacts the cathode, wherein the contact interface surface is configured with a ring shaped cross-section, and wherein the stinger extends along a straight centerline through a sidewall of the vessel to the contact interface surface;
wherein the stinger includes a shaft and a head attached to an end of the shaft;
wherein the head includes the interface contact surface and a second surface that is longitudinally recessed into the head from the interface contact surface along a centerline of the stinger, and the second surface is parallel with the interface contact surface; and
wherein an air gap is formed longitudinally along the centerline between the second surface and the cathode, and the air gap is formed laterally within the head.

11. The method of claim 10, further comprising water-cooling the stinger.

12. The method of claim 11, wherein the water cooling of the stinger comprises water cooling the head.

13. The method of claim 11, wherein the water cooling of the stinger comprises water cooling the shaft.

14. The method of claim 10, wherein
the shaft has a lateral shaft width;
the head has a lateral head width that is greater than the lateral shaft width; and
the lateral head width and the lateral shaft width are measured in a lateral direction that is perpendicular to a centerline of the stinger.

15. A cathodic arc vapor deposition system, comprising:
a vessel;
a fixed support; and
a stinger comprising a shaft and a head attached to the shaft;
the head positioned within the vessel, and the head configured with a contact interface surface adapted to contact a cathode and thereby retain the cathode between the fixed support and the head, and the contact interface surface having a ring shaped cross-section; and
the shaft extending along a straight centerline through a sidewall of the vessel to the head such that the straight centerline is perpendicular to the contact interface surface;
wherein the head is further configured with a second surface that is longitudinally recessed into the head from the interface contact surface along the straight centerline; and
wherein a longitudinal distance along the straight centerline from the second surface to the contact interface surface is less than a lateral width of the second surface.

16. The cathodic arc vapor deposition system of claim 1, wherein
the pocket extends laterally within the head to a pocket side surface; and
the pocket side surface extends longitudinally along the centerline from the contact interface surface to the pocket end surface.

17. The cathodic arc vapor deposition system of claim 1, wherein the pocket end surface is parallel with the contact interface surface.

18. The method of claim 10, wherein a longitudinal distance along the centerline from the second surface to the contact interface surface is less than a lateral width of the second surface.

* * * * *